United States Patent [19]
Yanof et al.

[11] Patent Number: 5,476,818
[45] Date of Patent: Dec. 19, 1995

[54] SEMICONDUCTOR STRUCTURE AND METHOD OF MANUFACTURE

[75] Inventors: Arnold W. Yanof, Tempe; William Dauksher, Mesa, both of Ariz.

[73] Assignee: Motorola, Inc., Schaumburg, Ill.

[21] Appl. No.: 293,350

[22] Filed: Aug. 19, 1994

[51] Int. Cl.[6] ........................................ H01L 21/60
[52] U.S. Cl. ........................ 437/209; 437/206; 437/211; 437/214; 437/217
[58] Field of Search .................................. 437/723, 724, 437/206, 209, 211, 214, 215, 217, 218, 219, 220

[56] References Cited

U.S. PATENT DOCUMENTS

| | | | |
|---|---|---|---|
| 4,563,640 | 1/1986 | Hasegawa | 324/158 |
| 4,970,577 | 11/1990 | Ogihara et al. | 257/723 |
| 5,137,836 | 8/1992 | Lam | 437/206 |
| 5,189,507 | 2/1993 | Carlomagno et al. | 257/724 |
| 5,276,289 | 1/1994 | Satoh et al. | 257/723 |
| 5,336,639 | 8/1994 | Nagaras et al. | 437/217 |

FOREIGN PATENT DOCUMENTS 0368262  11/1989  European Pat. Off. .

OTHER PUBLICATIONS

Munchmeyer et al., "Manufacture of three-dimensional microdevices using synchrotron radiation (Invited)", Rev. Sci Instrum. 63(1), Jan. 1992, pp. 713–721.

C. Barsotti et al., "Very High Density Probing", 1988 International Test Conference, Paper 30.2, pp. 608–614, Apr. 1988.

*Primary Examiner*—Brian E. Hearn
*Assistant Examiner*—Kevin M. Picardat
*Attorney, Agent, or Firm*—Rennie William Dover

[57] ABSTRACT

A semiconductor structure (8) comprising a semiconductor chip support structure (9), a circuit board substrate (40) with circuit board substrate probes (36) extending therefrom and a method for fabricating the semiconductor structure (8). The semiconductor chip support structure (9) includes, for example, clips (43, 53) to replaceably mount semiconductor chips (47, 48) to the semiconductor chip support structure (9). The circuit board substrate (40) is mated with the semiconductor chip support structure (9) so that the circuit board substrate probes (36) contact bonding pads (49) on the semiconductor chips (47, 48). If a semiconductor chip (47, 48) becomes damaged, the circuit board substrate (40) may be separated from the semiconductor chip support structure (9) and the damaged semiconductor chip (47, 48) replaced with a good semiconductor chip (47, 48).

13 Claims, 4 Drawing Sheets

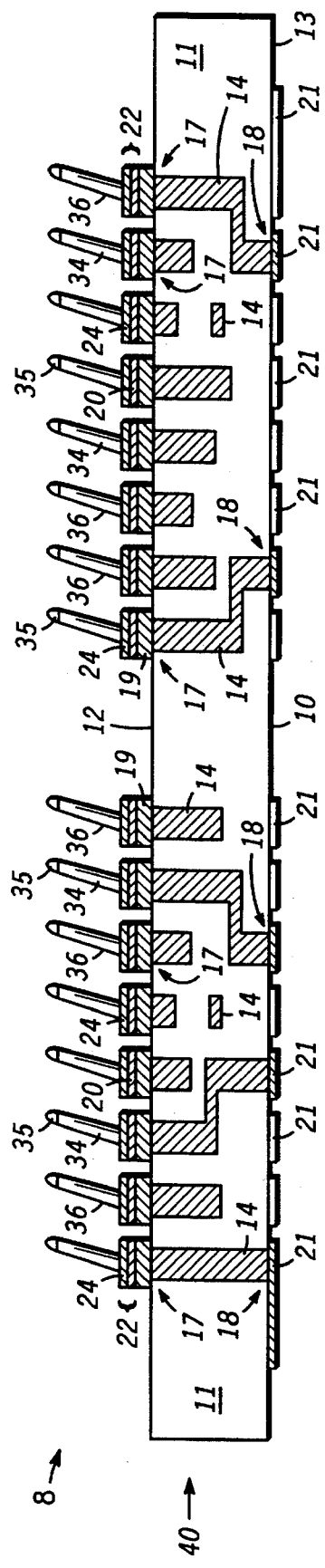
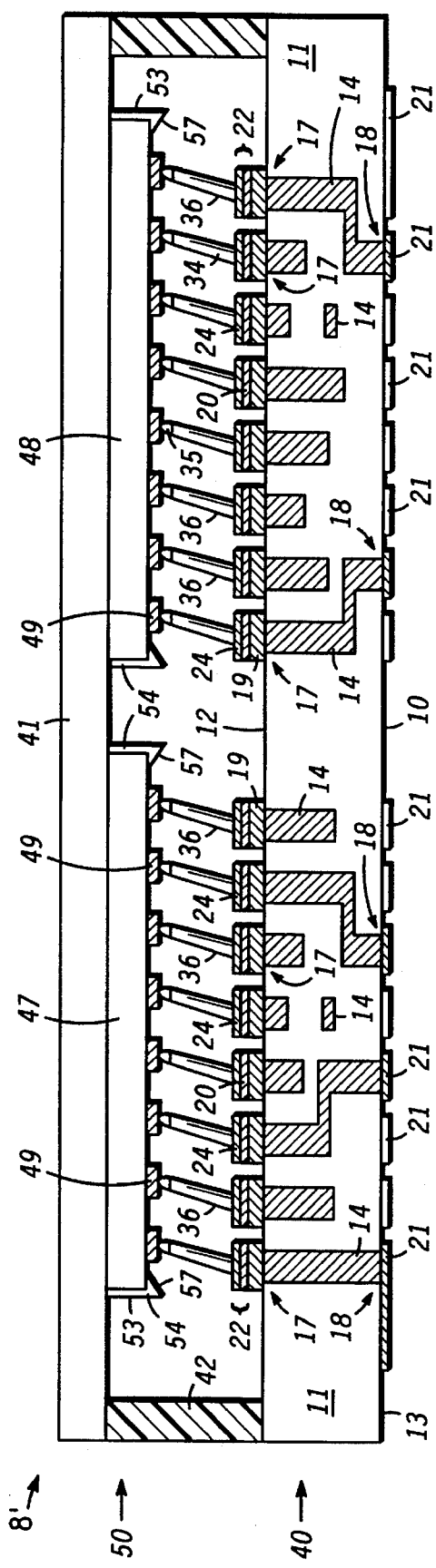

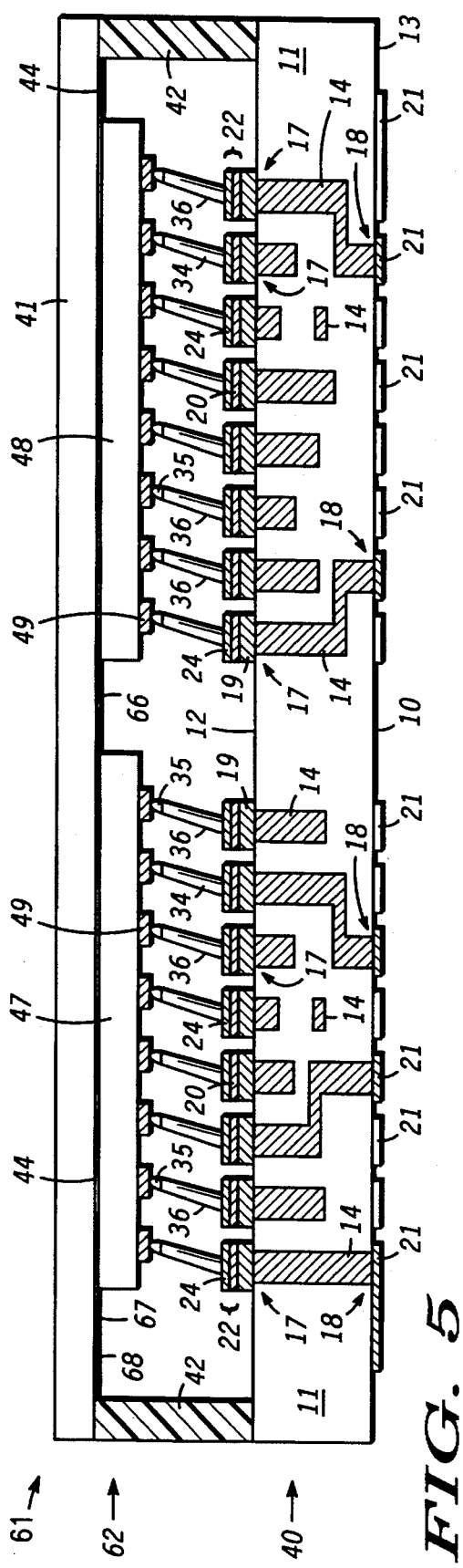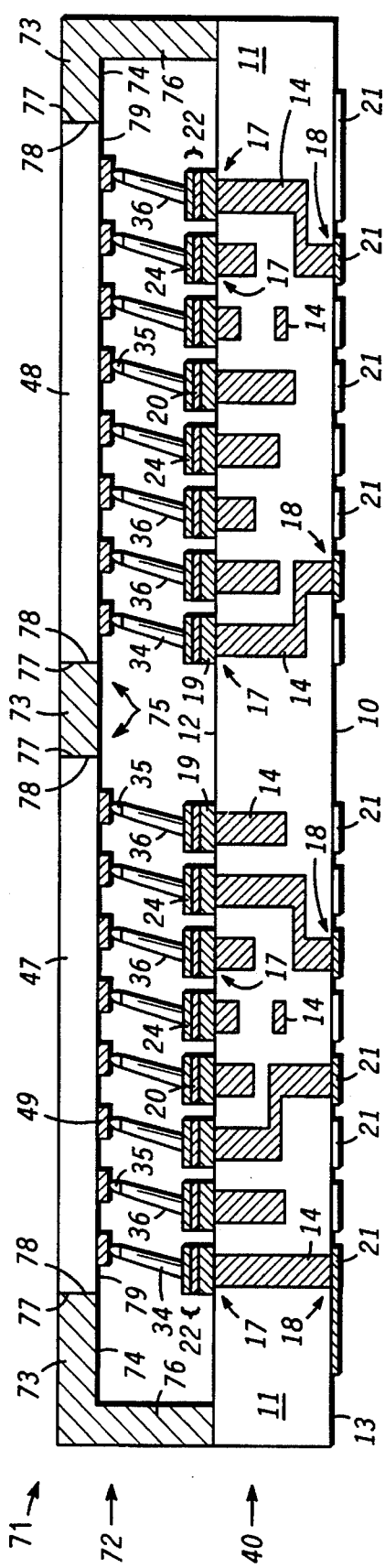

SEMICONDUCTOR STRUCTURE AND METHOD OF MANUFACTURE

The present application is related to copending U.S. patent application Ser. No. 08/293,365, Attorney's Docket No. CR08745, entitled "PROBE AND METHOD OF MANUFACTURE" filed on Aug. 19, 1994, by Arnold Yanof et al. and assigned to the same assignee, Motorola, Inc.

BACKGROUND OF THE INVENTION

The present invention relates, in general, to semiconductor structures, and more particularly, to a semiconductor structure having a semiconductor chip coupled to a circuit board substrate by a probe.

Generally, integrated devices are fabricated on a thin flat substrate material commonly referred to as a semiconductor wafer. After fabrication, the integrated devices on the semiconductor wafer are tested and the semiconductor wafer is separated or divided into individual semiconductor chips or dies. Subsequently, each chip is encapsulated in a plastic, ceramic, or metal package to protect the semiconductor chip from damage by mechanical stresses and moisture. In addition, the package may aid in dissipating heat from the semiconductor chip and provide a means for transmitting electrical signals to and from the semiconductor chip. Although the packages provide many benefits, they also degrade the electrical performance of the integrated devices by increasing propagation times of electrical signals between semiconductor chips, increasing inductive and capacitive parasitics, and increasing the area consumed by an integrated device.

To mitigate the drawbacks associated with individually packaging integrated devices, integrated device manufacturers have developed packages comprising a substrate having electrical interconnects on which unpackaged semiconductor chips are mounted. The semiconductor chips are electrically coupled to each other via the electrical interconnects. These packages, commonly referred to as multichip modules, decrease the distance between semiconductor chips, thereby consuming less area and decreasing the distance through which electrical signals are transmitted. In addition, parasitic inductances and capacitances are reduced. However, a drawback of these types of packages is that the semiconductor chips are permanently mounted on the substrate. Thus, if one semiconductor chip needs to be replaced because it is defective or needs upgrading or optimization, the whole module must be discarded because the semiconductor chips are permanently mounted and can not be replaced.

Accordingly, it would be advantageous to have a semiconductor structure and a means for manufacturing the semiconductor structure that allow temporary and repeatable make and break contact between a semiconductor chip and substrate by means of a contact probe. It would be of further advantage for the contact probe to be compliant so that bonding pads of different heights or variation in the lengths of the probes will not damage or permanently deform them or a semiconductor die on which the bonding pads are disposed.

BRIEF DESCRIPTION OF THE DRAWINGS

FIG. 3 illustrates an enlarged cross-sectional view of the circuit board substrate of FIG. 1;

FIG. 4 illustrates an enlarged cross-sectional view of a semiconductor module in accordance with a second embodiment of the present invention;

FIG. 5 illustrates an enlarged cross-sectional view of a semiconductor module in accordance with a third embodiment of the present invention;

FIG. 6 illustrates an enlarged cross-sectional view of a semiconductor module in accordance with a fourth embodiment of the present invention.

DETAILED DESCRIPTION OF THE DRAWINGS

Generally, the present invention provides a semiconductor device and a method for manufacturing the semiconductor device. In accordance with one embodiment of the present invention, the semiconductor device is a multichip module formed by replaceably mounting a semiconductor chip to a semiconductor chip support structure. Then, a probe extending from a circuit board substrate is mated to a conductive pad on the semiconductor chip and the circuit board substrate is secured to the semiconductor support structure. An advantage of the present invention is that if one of the semiconductor chips becomes defective or it is desired to upgrade a semiconductor chip, it can be replaced with a properly functioning semiconductor chip without damaging the other semiconductor chips in the module or damaging the module structure.

Figure 1:
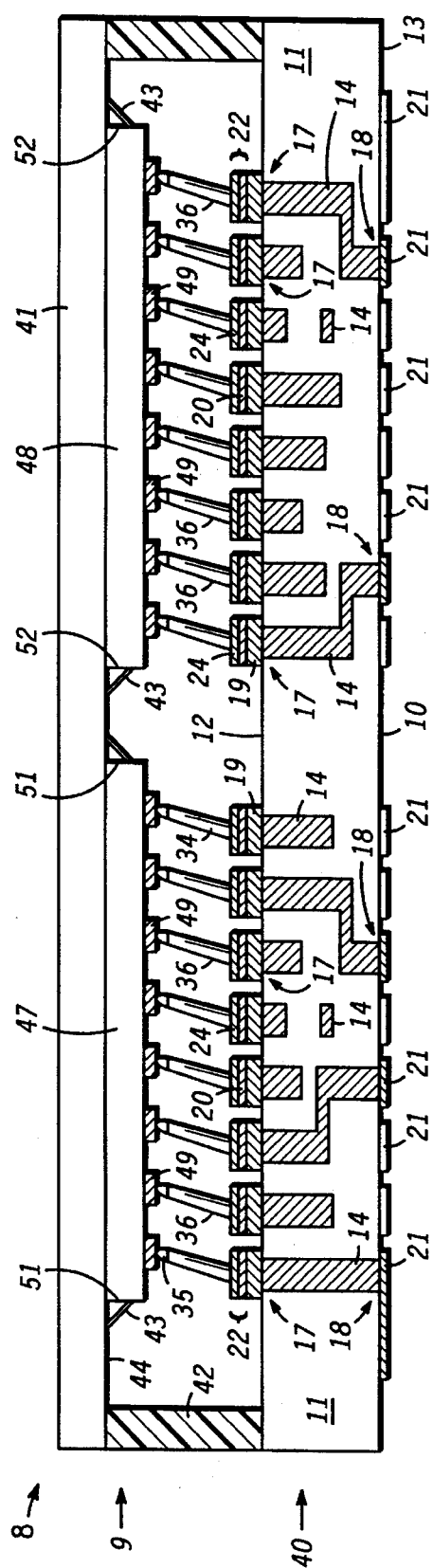
FIG. 1 illustrates an enlarged cross-sectional view of a semiconductor module in accordance with a first embodiment of the present invention.

FIG. 1 illustrates an enlarged cross-sectional view of a portion of a multi-chip module 8 in accordance with a first embodiment of the present invention. What is shown in FIG. 1 is circuit board substrate 40 coupled to a semiconductor chip support structure 9. Circuit board substrate 40 comprises a support structure 10 having metal filled vias 14 extending through support structure 10 and probes 36 extending from support structure 10. Preferably, support structure 10 comprises a substrate 11 having major surfaces 12 and 13. Metal filled vias 14 may extend through substrate 11 wherein one end 17 of each metal filled via 14 terminates at surface 12 and a second end 18 of each metal filled via 14 terminates at surface 13. It should be understood that the vias are not limited to vias extending through substrate 11, i.e., the metal filled vias 14 may terminate on interconnects, signal planes, ground planes, power planes, other metal filled vias, external bumps, external contact tabs, external pins, and the like. Contact pads 19 are formed on major surface 12 and in contact with ends 17. Likewise, contact or interconnect pads 21 are formed on major surface 13 and in contact with second ends 18. It should be understood that structures 21 are not limited to contact pads but may be conducting feedouts or electrical interconnects. Suitable materials for substrate 11 include polyimide, FR-4, bismaleimide triazine (BT) resin, ceramic materials, and the like. By way of example, support 10 is a printed circuit board. Techniques for manufacturing support structures such as printed circuit boards are well known to those skilled in the art.

A plating base or base plate 22 which provides a conductive path for the electrodeposition of probe tip material is formed on each contact pad 19. In one embodiment, plating base 22 is a two layer structure comprising an adhesion layer 20 having a plating seed layer 24 disposed thereon. The formation of plating base 22 is further described with reference to FIG. 2.

Figure 2:
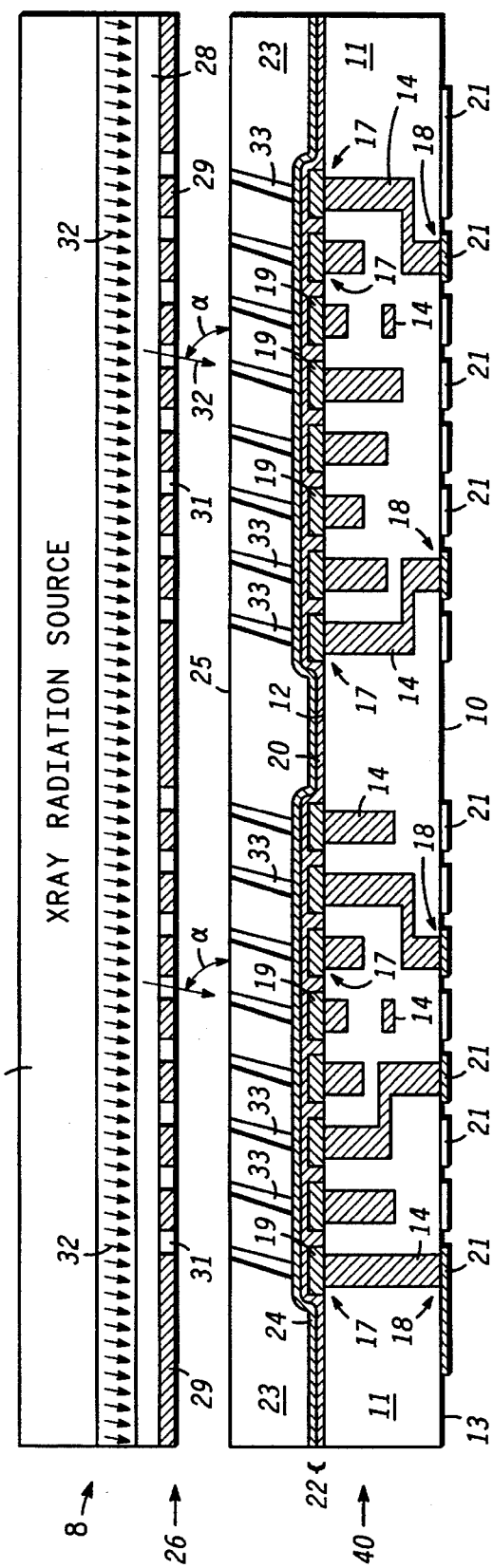
FIG. 2 illustrates an enlarged cross-sectional view of a circuit board substrate of FIG. 1 during a fabrication step.

FIG. 2 illustrates a highly enlarged cross-sectional view of support structure 10 of FIG. 1 during irradiation by x-ray radiation in accordance with the first embodiment of the present invention. What is shown in FIG. 2 is support structure 10 having plating base 22 formed on major surface 12 and contact pads 19. Plating base 22 provides a conductive path for the formation of probes 36 (shown in FIG. 1) by electrodeposition. Plating base 22 is, for example, a two layer structure comprising an adhesion layer 20 having a plating seed layer 24 disposed thereon. Suitable materials for adhesion layer 20 include titanium, chromium, and the like, whereas suitable materials for plating seed layer 24 include gold, nickel, and the like. By way of example, adhesion layer 20 is titanium having a thickness of approximately 100 angstroms and plating seed layer 24 is gold having a thickness of approximately 200 angstroms. It should be understood that the thicknesses of layers 20 and 24 are not limitations of the present invention. It should be further understood that, in accordance with the deposition process, layers 20 and 24 are conformal layers; however, layers 20 and 24 being conformal is not a limitation of the present invention. For example, the thickness of layers 20 and 24 may be increased to add mechanical stability to probe 36 shown in FIG. 3. Further, the mechanical stability of the probes shown in FIG. 3 may be further increased by etching wells or indentations (not shown) into substrate 11 at locations where conductive pads 19 are to be formed. These wells increase the mechanical stability of the probes by increasing the size of their base regions. It should also be noted that formation of the plating base may be omitted if contact pads 19 or ends 17 of metal filled vias 14 are accessible to the cathode of the plating equipment, i.e., contact pads 19 or ends 17 serves as the plating base.

In addition, FIG. 2 illustrates an x-ray mask 26 coupled to an x-ray radiation source 27. It should be understood that x-ray radiation source 27 shown in FIG. 2 is merely a representation of x-ray radiation sources that are well known to those skilled in the art. X-ray mask 26 comprises a thin membrane of low atomic weight material 28 having a patterned layer of high atomic weight material 29 disposed thereon. X rays are capable of traveling through thin membrane 28 but are absorbed by the high atomic weight material 29. Thus, high atomic weight material 29 is also referred to as an absorbing material.

Absorbing material 29 is patterned to have openings 31 through which x-ray radiation travels. Suitable materials for thin membrane 28 include $Si_xN_y$, SiC, diamond, doped Si, and the like, whereas suitable materials for the high atomic weight material include gold, tungsten, tantalum, and the like. It should be understood by those skilled in the art that in the formula $Si_xN_y$, the variables x and y are real numbers that represent atomic ratios of the constituent elements, e.g. stoichiometric silicon nitride is represented by $Si_3N_4$. It should be noted that x-ray masks such as x-ray mask 26 are well known in the art and are not limited to a thin membrane of low atomic weight material having a patterned layer of high atomic weight material disposed thereon. For example, x-ray mask 26 may be a self-supporting sheet of metal having holes cut therethrough using laser ablation. Further, x-ray radiation sources such as source 27 are also well known to those skilled in the art. For example, x-ray radiation source 27 may be a synchrotron. Other examples of an x-ray radiation sources 27 include x-ray tubes such as, for example, conventional metal anode x-ray tubes, and plasma sources such as, for example, focused laser plasma sources. It should be understood that the material for x-ray mask 26 and the type of x-ray radiation source 27 are not limitations of the present invention.

Plating base 22 is coated with a layer of resist 23 such as, for example, polymethylmethacrylate (PMMA) having a thickness ranging between approximately 50 microns (μm) and approximately 500 μm. Other suitable materials for layer of resist 23 include fluorinated polybutylmethacrylate, polymethacrylimide (PMI), polyoxymethylene (POM), and polyalkensulfone (PASO). It should be understood that resists for use in deep-etch x-ray lithography are well known to those skilled in the art.

In accordance with the first embodiment of the present invention, x-ray radiation source 27 transmits x-ray radiation (shown by arrows 32) towards x-ray mask 26. Although x-ray radiation 32 is absorbed by absorbing material 29, it travels through openings 31 and irradiates the portions of layer of resist 23 that are to be removed. Preferably, x-ray radiation 32 is transmitted at an angle so that it irradiates layer of resist 23 at an acute angle α relative to a top surface 25 of layer of resist 23. In other words, angle α is non-normal to surface 25. The angle α is also referred to as being an off-angle since it is oblique to surface 25. Preferably, acute angle α ranges between approximately 65 and 85 degrees. In addition, it is preferable to vary angle α in one or both directions, i.e. vary angle α up and down, or sideways, or in a combined elliptical motion to expose a greater portion of layer of resist 23 at plating base 22 than at top surface 25. Thus, the exposed portions of layer of resist 23 have a tapered shape having a longitudinal axis making an angle α relative to top surface 25.

Preferably, the exposing radiation is of sufficiently short wavelength, e.g., less than approximately 5 angstroms (Å), to penetrate the thickness of layer of resist 23 and to provide exposure of the resist down to the plating base 22. It should be understood that although x-ray lithography for integrated circuits is optimized at longer wavelengths, the harder x-rays are readily available from the same sources through proper choice of operating parameters and beamline components.

It should be noted that X-ray lithography in accordance with the present invention differs from the that used in standard integrated circuit and deep-etch lithography, electroforming, and moulding (LIGA) lithography techniques in that a reduced degree of collimation is required. LIGA is an acronym derived from a process described in the German language as Lithographic, Galvanoformung, Abformung. Therefore, the source and beamline of the x-ray radiation in the present invention is optimized for intensity of radiation to reduce exposure time at the expense of coherence and source spot size. For example, in the case of compact sources, e.g., non-synchrotron sources, the exposure can be performed at a reduced distance from the source, as compared with x-ray lithography used in the manufacture of integrated circuits. The intensity of radiation and the consequent rate of exposure at the resist is then increased as the inverse square of the distance to the source. Moreover, an increased penumbra effect helps produce the desired taper in the probe tip and thus is beneficial.

Further and in contrast to x-ray lithography for integrated circuit and LIGA applications, where strictly normal incidence of radiation is required, lithographic techniques in accordance with the present invention use a mechanical fixture to set and to vary an oblique angle of incidence of the radiation. Moreover, x-ray lithography for IC applications, requires very high resolution masks and a gap of less than approximately 40 microns between mask and wafer to prevent blurring due to penumbral and diffraction effects. The x-ray lithographic technique in accordance with the present invention, on the other hand, uses a low resoluteion mask, wherein the gap between mask and wafer can be greater than 100 microns. Thus, the x-ray lithographic technique of the present invention use a less costly and more physically robust x-ray mask, as well as a much less costly mask-to-substrate alignment tool, than conventional photo-lithographic techniques used for the manufacture of integrated circuits. For example, the mask for the present invention can be manufactured by laser ablation of a 25 micron thick tungsten sheet to provide a very low cost mask with sufficient precision.

The exposed portions of layer of resist 23 are developed using a developer such as, for example, methyl isobutyl ketone (MIBK) and isopropyl alcohol (IPA), and rinsed to form openings 33. It should be noted that openings 33 are tapered having a greater diameter at plating base 22 than at top surface 25. In addition, a longitudinal axis of openings 33 makes an angle $\alpha$ relative to plating base 22 and to top surface 25.

Now referring to FIG. 3, probes 36 are formed on support structure 10 by electroplating a conductive material on the exposed portions of plating base 22, thereby forming a circuit board substrate 40 having probes contacts 36. The electroplating material fills openings 33 (shown in FIG. 2). Suitable electroplating materials include nickel, gold, a combination of nickel and gold, copper, palladium, tin, and the like. As those skilled in the art will appreciate, a combination of layers of the electroplating materials may be used to enhance the strength of the base region and lower the contact resistance at the tip. For example, a base 34 of probe tip 36 may be formed by partially filling opening 33 with nickel and the tip region 35 of probe 36 may be formed by partially filling opening 33 with one of gold or palladium. The nickel provides strength to probe 36, whereas the gold lowers the contact resistance between probe 36 and a structure contacted by probe 36.

The remaining portions of layer of resist 23 are removed using techniques well known to those skilled in the art. In addition, the portions of plating base 22 between conductive pads 19 are removed to expose surface 12. In other words, conductive pads 19 are electrically isolated from one another. Techniques for selectively removing portions of a plating base 22 are known to those skilled in the art.

Probes 36 are tapered and have a longitudinal axis that makes an acute angle $\alpha$ relative to plating base 22. Preferably, the portion of probes 36 in contact with plating base 22, i.e., the base portion of probes 36 have a diameter of approximately 25 μm and the portions of probe 36 that form the tip have a diameter of approximately 10 μm. Tapering probes 36 allows them to scrub bonding pads 49 of FIG. 1 when contacting the bonding pads and distributes stress so that elastic compliance at the tip is maximized, while stress concentration at the base is avoided. Angling probes 36 so that they have a longitudinal axis that makes the acute angle $\alpha$ provides probes 36 with compliance in both normal and lateral directions; therefore, probes 36 will contact pads with a low-force scrubbing action and accommodate pads of differing height without buckling.

Referring again to FIG. 1, semiconductor chip support structure 9 comprises a substrate 41 having a circuit board substrate mount 42 and fastening clips 43. Suitable materials for substrate 41 include metals such as copper, aluminum, and the like; printed circuit board material such as polyimide, FR-4, BT resin, ceramic materials, and the like; and metal matrix composite materials such as aluminum impregnated silicon carbide, and the like. By way of example, substrate 41 is a BT resin having a surface 44, wherein beryllium-copper clips 43 extend from surface 44. Circuit board substrate mount 42 may be formed as an annular structure surrounding the semiconductor chips and attached to semiconductor support structure 9, wherein the material of circuit board substrate mount 42 may be printed circuit board material, metal, or metal matrix composite material. It should be understood that the shape of circuit board substrate mount 42 is not a limitation of the present invention. For example, circuit board substrate mount 42 may be attached adjacent two opposing edges of semiconductor chip support structure 9 rather than surrounding the semiconductor chips, or circuit board substrate mount 42 and substrate 41 may be formed as a unitary structure. It should be further understood that the height of circuit board substrate mount 42 is selected to permit probes 36 to electrically contact corresponding bonding pads 49 on semiconductor chips 47 and 48 and to permit the scrubbing of bonding pads 49 by probes 36 to ensure that probes 36 electrically contact bonding pads 49.

Clips 43 are fastened to substrate 41 and form semiconductor chip receiving areas that conform to the respective shapes of semiconductor chips 47 and 48, wherein the areas of the semiconductor chip receiving areas is slightly smaller than the areas of the respective semiconductor chips 47 and 48. Semiconductor chips, such as chips 47 and 48, having bonding pads or conductive pads 49 formed thereon are inserted into their respective chip receiving areas. Clips 43 apply a frictional force against surfaces 51 of semiconductor chip 47 and against surfaces 52 of semiconductor chip 48, thereby securing semiconductor chips 47 and 48 onto substrate 41. In other words, semiconductor chips 47 and 48 are mounted to semiconductor chip support structure 9. Circuit board substrate mount 42 is mated with and bonded to circuit board substrate 40. It should be understood that by mating circuit board substrate mount 42 with circuit board substrate 40, probes 36 electrically contact, i.e., become mated to, their respective bonding pads 49. Since probes 36 are angled, they are compliant allowing them to bend but not become permanently deformed when contacting bonding pads 49. Thus, probes 36 and bonding pads 49 are not damaged due to variations in length or height, respectively, due to, for example, process variations.

It should be noted that bonding circuit board substrate mount 42 to circuit board substrate 40 is not a limitation of the present invention and the bond can be broken without damaging circuit board substrate 40, circuit board substrates mount 42, and more particularly semiconductor chips 47 and 48. Thus, a module 8 having a defective semiconductor chip may be repaired by replacing the defective semiconductor chip. For example, semiconductor chip support 9 may be separated from circuit board substrate 40, thereby decoupling probes 36 from bonding pads 49. Then, the semiconductor chip to be replaced is removed from semiconductor chip support 9 using, for example, tweezers. The semiconductor chip is replaced with a good semiconductor chip and circuit board substrate 40 is bonded to circuit board substrate mount 42.

FIG. 4 illustrates a highly enlarged cross-sectional view of a portion of a multi-chip module 8' in accordance with a second embodiment of the present invention and comprises circuit board substrate 40 coupled to a semiconductor chip support 50 having clips 53. Thus, a prime (') has been added to reference numeral 8 to distinguish between multi-chip modules comprising semiconductor chip support 9 from multi-chip modules comprising semiconductor chip support 50. It should be noted that the difference between semiconductor chip support 9 and semiconductor chip support 50 is the type of clips, i.e., clips 53 are different from clips 43. More particularly, clips 53 comprise elongated structures 54 having a lip 57. Clips 53 are pivotally mounted to substrate 41 at an end of elongated structures 54 opposite the end having lip 57. To insert semiconductor chips into or remove semiconductor chips from the semiconductor chip receiving areas, clips 53 are pivoted such that a longitudinal axis of elongated structures 54 form an acute angle with substrate 41. The semiconductor chips 47 and 48 are placed in the semiconductor chip receiving areas and clips 53 are pivoted so that lips 57 overlie top surfaces of semiconductor chips 47 and 48, thereby holding semiconductor chips 47 and 48 in position in the semiconductor chip receiving area.

FIG. 5 illustrates a highly enlarged cross-sectional view of a portion of a multi-chip module 61 in accordance with a third embodiment of the present invention. Multi-chip module 61 comprises a circuit board substrate 40 coupled to a semiconductor chip support 62. More particularly, semiconductor chip support 62 comprises substrate 41 having major surface 44 and circuit board substrate mount 42, wherein major surface 44 is covered by a support film 66. Support film 66 is a two-sided low-tack contact material having major surfaces 67 and 68 wherein major surface 68 adheres to surface 44. Suitable support films include polyester tapes such as those sold under the Gel-Pak™ product line herein referred to as the support film. Gel-Pak™ is a trademark of the Chip Carrier Shipping System Division of Vichem Corporation which is located at 756 North Pastoria Avenue, Sunnyvale, Calif., 94086.

Semiconductor chips 47 and 48 are placed on portions of major surface 67 which is of sufficient tackiness to hold semiconductor chips 47 and 48 in place. It should noted that semiconductor chips 47 and 48 are positioned so that probes 36 on circuit board substrate 40 are capable of mating with bonding pads 49 on chips 47 and 48. Probe card mount 42 is mated with and bonded to circuit board substrate 40 to form multi-chip module 61. It should be understood that by mating circuit board substrate mount 42 with circuit board substrate 40, probes 36 electrically contact, i.e., become mated to, their respective bonding pads 49.

If any of the semiconductor chips of multi-chip module 61 are defective, module 61 may be repaired by replacing the defective semiconductor chip. For example, semiconductor chip support 62 may be separated from circuit board substrate 40, thereby decoupling probes 36 from bonding pads 49. Then, the defective semiconductor chip is removed from semiconductor chip support 9 by pulling it out using, for example, tweezers. The defective semiconductor chip is replaced with a good semiconductor chip and circuit board substrate 40 is again bonded to circuit board substrate mount 42.

FIG. 6 illustrates a highly enlarged cross-sectional view of a portion of a multi-chip module 71 in accordance with a fourth embodiment of the present invention. Multi-chip module 71 comprises a circuit board substrate 40 coupled to a semiconductor chip support 72. More particularly, semiconductor chip support 72 comprises substrate 73 having major surface 74, recesses 75 for receiving semiconductor chips 47 and 48, and circuit board substrate mounts 76. By way of example, circuit board substrate mounts 76 are legs or lips that may be formed by bending or forming portions of semiconductor chip support 72 along its periphery. It should be understood that the peripheral portions adjacent one or more edges of semiconductor chip support 72 may be bent to forms circuit board substrate mounts 76. Recess 75 is a receptacle having edges 77 for gripping edges 78 of semiconductor chips 47 and 48. Thus, recesses 75 have a first area and semiconductor chips 47 and 48 have a second area, wherein the second area is larger than the first area. By way of example, semiconductor chips 47 and 48 are rectangular shaped and have a thickness equivalent to the thickness of semiconductor chip support 72. Further, the shape of recesses 75 corresponds to the shapes of semiconductor chips 47 and 48. In other words, recess 75 is a rectangle having opposing edges for rectangular shaped semiconductor chips, a circle for circular shaped semiconductor chips, etc. Accordingly, a rectangular recess 75 is bounded by edges 77 and semiconductor chips 47 and 48 have four edges 78 that correspond to edges 77. Preferably, top surfaces 79 of semiconductor chips 47 and 48 are coplanar with major surface 74 when semiconductor chips 47 and 48 are secured or attached to semiconductor chip support 72. It should be understood that the sizes of semiconductor chips 47 and 48 are not a limitation of the present invention and that semiconductor chips 47 and 48 may be of different sizes from each other.

Recesses 75 may be formed using commonly known techniques such as laser milling, stamping, punching, etc. The method for forming recesses such as recesses 75 is not a limitation of the present invention. The dimensions of recesses 75 are selected such that, at room temperature, a compressive stress of at least 75 MegaPascals exists between edges 78 of semiconductor chips 47 and 48, when these semiconductor chips are within their respective recesses. Thus, edges 77 of recesses 75 grip corresponding edges 78 of semiconductor chips 47 and 48. Methods for inserting semiconductor chips into recesses may be found in U.S. Pat. No. 5,336,639 by Benamanahalli K. Nagaraj et al. which issued on Aug. 9, 1994, and is assigned to the same assignee, Motorola Inc. U.S. Pat. No. 5,336,639 is hereby incorporated herein by reference.

If any of the semiconductor chips of multi-chip module 71 are defective, module 71 may be repaired by replacing the defective semiconductor chip. For example, semiconductor chip support 72 may be separated from circuit board substrate 40, thereby decoupling probes 36 from bonding pads 49. Then, the defective semiconductor chip is removed from semiconductor chip support 72 by heating semiconductor chip support 72 to expand recesses 75 such that edges 78 are not gripped by corresponding edges 77 and mechanically removing the defective semiconductor chip. The defective semiconductor chip is replaced with a good semiconductor chip and semiconductor chip support 72 is cooled so that edges 78 of the good semiconductor chip are gripped by corresponding edges 77. Then, circuit board substrate 40 is again bonded to circuit board substrate mount 76.

Figure 7:
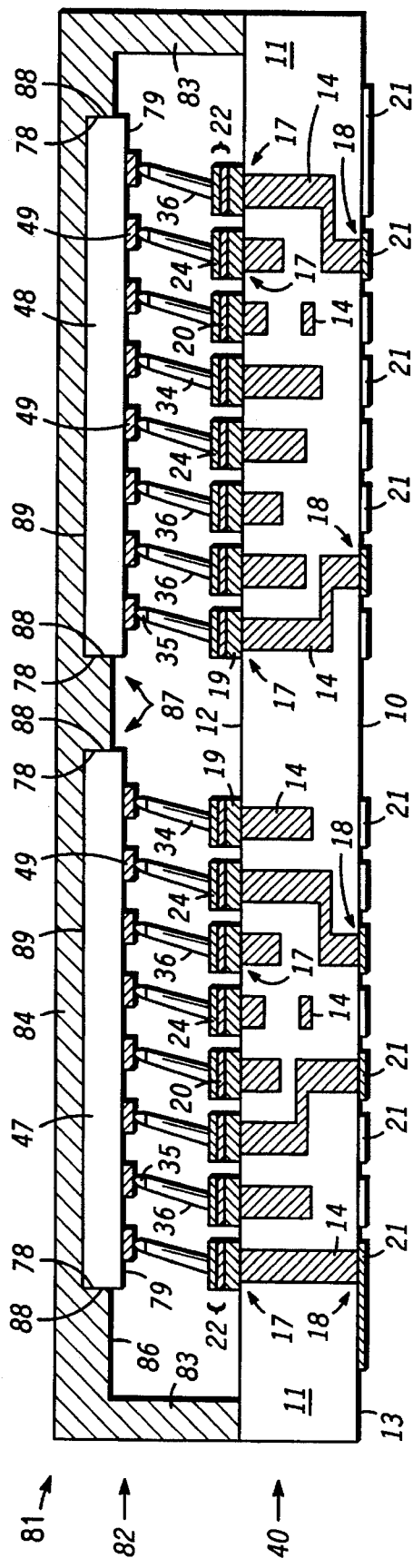
FIG. 7 illustrates an enlarged cross-sectional view of a semiconductor module in accordance with a fifth embodiment of the present invention.

FIG. 7 illustrates a highly enlarged cross-sectional view of a portion of a multi-chip module 81 in accordance with a fifth embodiment of the present invention. Multi-chip module 81 comprises a circuit board substrate 40 coupled to a semiconductor chip support 82 by bonding it to a circuit board substrate mount 83. More particularly, semiconductor chip support 82 comprises substrate 84 having major surface 86, recesses 87 for receiving semiconductor chips 47 and 48, and circuit board substrate mounts 83. By way of example, circuit board substrate mounts 83 are legs or lips that may be formed by bending or forming portions of semiconductor chip support 82 along its periphery. It should be understood that the peripheral portions adjacent one or more edges of semiconductor chip support 82 may be bent to form circuit board substrate mounts 83. Recesses 87 or receptacles have edges 88 for gripping edges 78 of semiconductor chips 47 and 48. In addition, recesses 87 have floors 89 on which semiconductor chips 47 and 48 rest. It should be understood that the difference between semiconductor chip supports 72 and 82 is that chip support 82 includes floors 89. Thus, top surfaces 79 of semiconductor chips 47 and 48 are not coplanar with major surface 86 when semiconductor chips 47 and 48 are secured or attached to semiconductor chip support 82, i.e., semiconductor chips 47 and 48 protrude from major surface 86.

Like recesses 75 shown in FIG. 6, recesses 87 have a first area and semiconductor chips 47 and 48 have a second area, wherein the second area is larger than the first area. By way of example, semiconductor chips 47 and 48 are rectangular shaped and have a thickness equivalent to the thickness of semiconductor chip support 82. Further, the shape of recesses 87 corresponds to the shapes of semiconductor chips 47 and 48. The dimensions of recesses 87 are selected such that, at room temperature, a compressive stress of at least 75 MegaPascals exists between edges 78 of semiconductor chips 47 and 48, when these semiconductor chips are within their respective recesses. Thus, edges 88 of recesses 87 grip corresponding edges 78 of semiconductor chips 47 and 48.

If any of the semiconductor chips of multi-chip module 81 are defective, module 81 may be repaired by replacing the defective semiconductor chip. For example, semiconductor chip support 82 may be separated from circuit board substrate 40, thereby decoupling probes 36 from bonding pads 49. Then, the defective semiconductor chip is removed from semiconductor chip support 82 by heating semiconductor chip support 82 to expand recesses 87 such that edges 78 are not gripped by corresponding edges 88 and mechanically removing the defective semiconductor chip. The defective semiconductor chip is replaced with a good semiconductor chip and semiconductor chip support 82 is cooled so that edges 78 are gripped by corresponding edges 88. Then, circuit board substrate 40 is again bonded to circuit board substrate mount 83.

By now it should be appreciated that a semiconductor structure such as a multichip module and a method for its manufacture have been provided. The present invention significantly improves multichip modules because it allows repeatable make and break contact between circuit board substrate probes and bonding pads as well as replacement of defective chips in the multichip modules. It should be noted that the implementation of repetitive contacts, i.e., make and break contacts, has not been pursued because of the inability to economically and reliably replace defective semiconductor chips in the module. Thus, the present invention enables both repetitive contact formation in multichip modules and replacement of defective semiconductor chips. Thus, the present invention improves the yield and decreases the cost of multichip modules. Further, the probes of the present invention are fabricated using lithographic techniques, thus they can be fabricated in a peripheral array or in an area array. Accordingly, the bonding pad configuration on a semiconductor chip and the location of the semiconductor chips in the multichip module are not limitations of the present invention.

While specific embodiments of the invention have been shown and described, further modifications and improvements will occur to those skilled in the art. It is understood that this invention is not limited to the particular forms shown and it is intended for the appended claims to cover all modifications of the invention which fall within the true spirit and scope of the invention. For example, the semiconductor chips may be attached to a substrate using a soluble glue.

We claim:

1. A method for manufacturing a semiconductor module, comprising the steps of:

providing a semiconductor chip support having a circuit board substrate mount;

providing a circuit board substrate having at least one probe extending therefrom;

replaceably mounting at least one semiconductor chip to the semiconductor chip support, wherein solder is absent between the at least one semiconductor chip and the semiconductor chip support and the at least one semiconductor chip has at least one conductive pad disposed thereon;

mating the at least one probe to the at least one conductive pad; and securing the circuit board substrate to the circuit board substrate mount.

2. The method of claim 1, wherein the step of providing a circuit board substrate comprises the steps of:

providing a support structure having a first surface and at least one contact pad;

forming a first layer of resist over the first surface and the at least one contact pad;

forming at least one opening through the first layer of resist, the at least one opening having a longitudinal axis that makes an acute angle with the first surface;

filling the at least one opening with a conductive material; and removing at least a portion of the first layer of resist adjacent the conductive material, wherein the conductive material serves as the at least one probe.

3. The method of claim 1, wherein the step of providing a semiconductor chip support includes providing the semiconductor chip support having a major surface and at least one recess extending from the major surface into the semiconductor chip support, the at least one recess adapted to accept the at least one semiconductor chip.

4. The method of claim 3, wherein the step of providing a semiconductor chip support includes providing the semiconductor chip support having at least one recess, wherein the at least one recess has lateral boundaries corresponding to lateral boundaries of the at least one semiconductor chip and an area of the at least one recess is less than an area of the at least one semiconductor chip and the step of replaceably mounting at least one semiconductor chip to the semiconductor chip support further comprises the steps of:

expanding the at least one recess to have an area greater than the area of the at least one semiconductor chip;

placing the at least one semiconductor chip in the at least one recess; and contracting the at least one recess, wherein the lateral boundaries of the at least one chip contact the lateral boundaries of the semiconductor chip.

5. The method of claim 4, wherein the step of providing the semiconductor chip support having at least one recess includes providing the at least one recess having a floor.

6. The method of claim 4, wherein the step of expanding the at least one recess includes heating the at least one recess and the step of contracting the at least one recess includes cooling the at least one recess.

7. The method of claim 1, wherein the step of providing a semiconductor chip support includes providing the semiconductor chip support comprising an adhesive film, wherein a first side of the adhesive film contacts a substrate.

8. The method of claim 7, wherein the step of replaceably mounting at least one semiconductor chip to the semiconductor chip support includes placing the at least one semiconductor chip on a portion of a second side of the adhesive film.

9. The method of claim 1, further including the step of replacing the at least one semiconductor chip by separating the circuit board substrate from the circuit board substrate mount; removing the at least one semiconductor chip from the semiconductor chip support; replaceably mounting another semiconductor chip to the semiconductor chip support, wherein solder is absent between the at least one semiconductor chip and the semiconductor chip support and the another semiconductor chip has at least one conductive pad disposed thereon; mating the at least one probe to the at least one conductive pad disposed on the another semiconductor chip; and securing the circuit board substrate to the circuit board substrate mount.

10. The method of claim 1, wherein the step of providing a semiconductor chip support includes providing the semiconductor chip support having a clip and the step of replaceably mounting at least one semiconductor chip to the semiconductor chip support includes mating the at least one semiconductor support with the clip.

11. A method for manufacturing a semiconductor structure, comprising the steps of:

providing a circuit board substrate, the steps for forming the circuit board substrate comprising:

providing a support structure having a first surface and at least one contact pad;

forming a first layer of resist over the first surface and the at least one contact pad;

forming at least one opening through the first layer of resist, the at least one opening having a longitudinal axis that makes an acute angle with the first surface;

filling the at least one opening with a conductive material; and removing at least a portion of the first layer of resist adjacent the conductive material, wherein the conductive material serves as a probe and the support structure serves as the circuit board substrate; providing a semiconductor chip support structure;

replaceably mounting a semiconductor chip to the semiconductor chip support structure, wherein solder is absent between the at least one semiconductor chip and the semiconductor chip support and the semiconductor chip has a bonding pad on a surface; and mating the circuit board substrate to the support structure, wherein the probe contacts the bonding pad.

12. The method of claim 11, wherein the step of providing a circuit board substrate further comprises the steps of forming at least one opening through the first layer of resist and filling the at least one opening with a conductive material comprise the steps of:

exposing a portion of the first layer of resist with radiation;

removing the exposed portion of the first layer of resist to form a first opening;

filling the first opening with a first conductive material;

forming a second layer of resist on the first layer of resist and the conductive material;

exposing a portion of the second layer of resist, wherein the portion of the second layer of resist overlaps an edge of the conductive material;

removing the exposed portion of the second layer of resist to form a second opening; and filling the second opening with a second conductive material.

13. The method of claim 11, wherein the step of providing a semiconductor chip support structure includes providing the semiconductor chip support structure having a recess and the step of replaceably mounting a semiconductor chip to the semiconductor chip support structure comprises the steps of:

expanding the recess;

placing the semiconductor chip in the expanded recess; and contracting the recess, wherein edges of the recess grip edges of the semiconductor chip.

* * * * *